United States Patent [19]
Fifield et al.

[11] Patent Number: 5,550,488
[45] Date of Patent: Aug. 27, 1996

[54] SELF TIMED DRIVER

[75] Inventors: John A. Fifield, Underhill; Lawrence G. Heller, S. Burlington, both of Vt.

[73] Assignee: International Business Machines Corporation, Armonk, N.Y.

[21] Appl. No.: 466,904

[22] Filed: Jun. 6, 1995

[51] Int. Cl.$^6$ .......................... H03K 19/00; H03K 19/02
[52] U.S. Cl. .............................................. 326/58; 327/161
[58] Field of Search ....................... 326/56, 58; 327/161

[56] References Cited

U.S. PATENT DOCUMENTS

| | | | |
|---|---|---|---|
| 4,697,107 | 9/1987 | Haines | 326/58 |
| 5,027,326 | 6/1991 | Jones | 365/221 |
| 5,097,152 | 3/1992 | Kohda et al. | 326/58 |
| 5,159,216 | 10/1992 | Taylor et al. | 326/57 |
| 5,218,239 | 6/1993 | Boomer | 326/58 |
| 5,225,723 | 7/1993 | Drako et al. | 327/161 |
| 5,345,421 | 9/1994 | Iwamura et al. | 365/189.05 |
| 5,434,519 | 7/1995 | Trinh et al. | 326/58 |

OTHER PUBLICATIONS

Chandrakasan et al., "A Low–Power Chipset for a Portable Multimedia I/O Terminal", IEEE Journal of Solid–State Circuits, vol. 29, No. 12, Dec. '94 pp. 1415–1428.

*Primary Examiner*—Edward P. Westin
*Assistant Examiner*—Richard Roseen
*Attorney, Agent, or Firm*—Schmeiser, Olsen & Watts; Eugene I. Shkurko

[57] ABSTRACT

A self-timed tri-state driver circuit for a dual-rail differential input and single-ended output is disclosed. The circuit generates a tri-state mode in response to an Output Enable (OE) input pulsing low. The OE signal input is driven high to place the driver circuit into a ready state. The circuit is maintained in a tri-state mode until data appears at the inputs. Once a data signal is received after the tri-state circuit is in the ready state, the output immediately outputs this signal. Therefore, the output of the driver is self-timed from the arrival of the data.

12 Claims, 3 Drawing Sheets

SELF TIMED DRIVER

BACKGROUND OF THE INVENTION

1. Technical Field

The invention relates generally to output driver circuits and, more specifically, to tri-state output driver circuits with dual-rail differential inputs and self-timed single ended outputs.

2. Background Art

In a tri-state output driver circuit, the output of the circuit should optimally reflect either the inputted data being driven through it (a high logic voltage or a low logic voltage) or be in a tri-state mode, a mode that electrically isolates the output. The accuracy of the data driven through the circuit depends mainly upon the issuance of an Output Enable (OE) signal when the system is ready to receive the data and the presence of the data at the circuit's input devices. The output of the driver circuit should remain in tri-state mode until the data is present at the input (valid) and the OE signal is issued.

Traditionally, the prior art driver circuits are taken out of tri-state mode when the OE signal is issued. Although a system may be ready for the data and will accordingly issue an OE signal, the data may not be present at the input of the driver circuit. Consequently, faulty data may be sent through the circuit. Thus, the OE signal of traditional circuits is delayed for a certain amount of time to ensure the data to be driven is valid.

U.S. Pat. No. 5,159,216, "Precision Tristate Output Driver Circuit Having a Voltage Clamping Feature," (issued October 1992 to Taylor et at. and assigned to TriQuint Semiconductor, Inc.), which is hereby incorporated by reference, discloses a traditional tri-state output circuit in which the OE signal is delayed to ensure the validity of the data. Once the OE signal is issued, the circuit will then drive the inputted data to the output terminal. The data may be present at the input of the driver circuit, but will not be driven through until the OE signal is issued.

This method may be useful in ensuring valid data in slower systems, but can be detrimental in high clock speed systems. The delay of the OE signal becomes a significant portion of overall access time, ultimately degrading the system's performance.

Examples of other driver systems may be found in the following United States Patents and article, which are hereby incorporated by reference: U.S. Pat. No. 5,345,421, "High Speed, Low Noise Semiconductor Storage Device," (issued September 1994 to Iwamura et al. and assigned to Hitachi, Ltd.); U.S. Pat. No. 5,027,326, "Self-timed Sequential Access Multiport Memory," (issued June 1991 to Jones and assigned to Dallas Semiconductor Corporation); and the article "A Low-Power Chipset for a Portable Multimedia I/O Terminal," *IEEE Journal of Solid-State Circuits*, Vol. 29, No. 12, December 1994, pp. 1415–1428.

Although each aforementioned reference provides a way to operate with various drivers and circuits in a system, they do not disclose a way of improving the access time of a system through a tri-state output driver circuit that will not delay the OE signal without affecting the validity of the data. Accordingly, a need has developed in the art for tri-state driver circuits that are truly self-timed from the arrival of input data.

SUMMARY OF THE INVENTION

It is thus an advantage of the present invention to provide a tri-state driver circuit system that issues and implements an Output Enable (OE) signal when the system is ready to receive data.

It is another advantage of the invention to provide a tri-state driver circuit that will remain in tri-state mode even after the OE signal is issued when no data is present.

It is also an advantage of the present invention to provide a tri-state driver circuit system that, after the OE signal is issued, will immediately gate the data from the input to the output of the tri-state driver circuit.

The foregoing and other advantages of the invention are realized by a tri-state driver circuit system that utilizes a dual-rail differential input and self-timed single ended output with dual control of the output. The circuit generates a tri-state mode in response to the OE signal being pulsed low.

When the system is ready to receive data, the OE input is driven high to place the driver circuit into a ready state. The circuit is maintained in a tri-state mode until data appears at the inputs.

The ready state prepares the tri-state circuit, independent of any clock signal, to output a one or zero data signal in response to the input receiving a true or complement data signal respectively. Once a true or complement data signal is received after the tri-state circuit is in the ready state, the output immediately outputs the one or zero signal, respectively. Therefore, the output of the driver is truly self-timed from the arrival of the data.

BRIEF DESCRIPTION OF DRAWINGS

The foregoing and other objects, features and advantages of the invention will be apparent from the following more particular description of preferred embodiments of the invention, as illustrated in the accompanying drawings.

DETAILED DESCRIPTION OF THE BEST MODE FOR CARRYING OUT THE INVENTION

Figure 1:
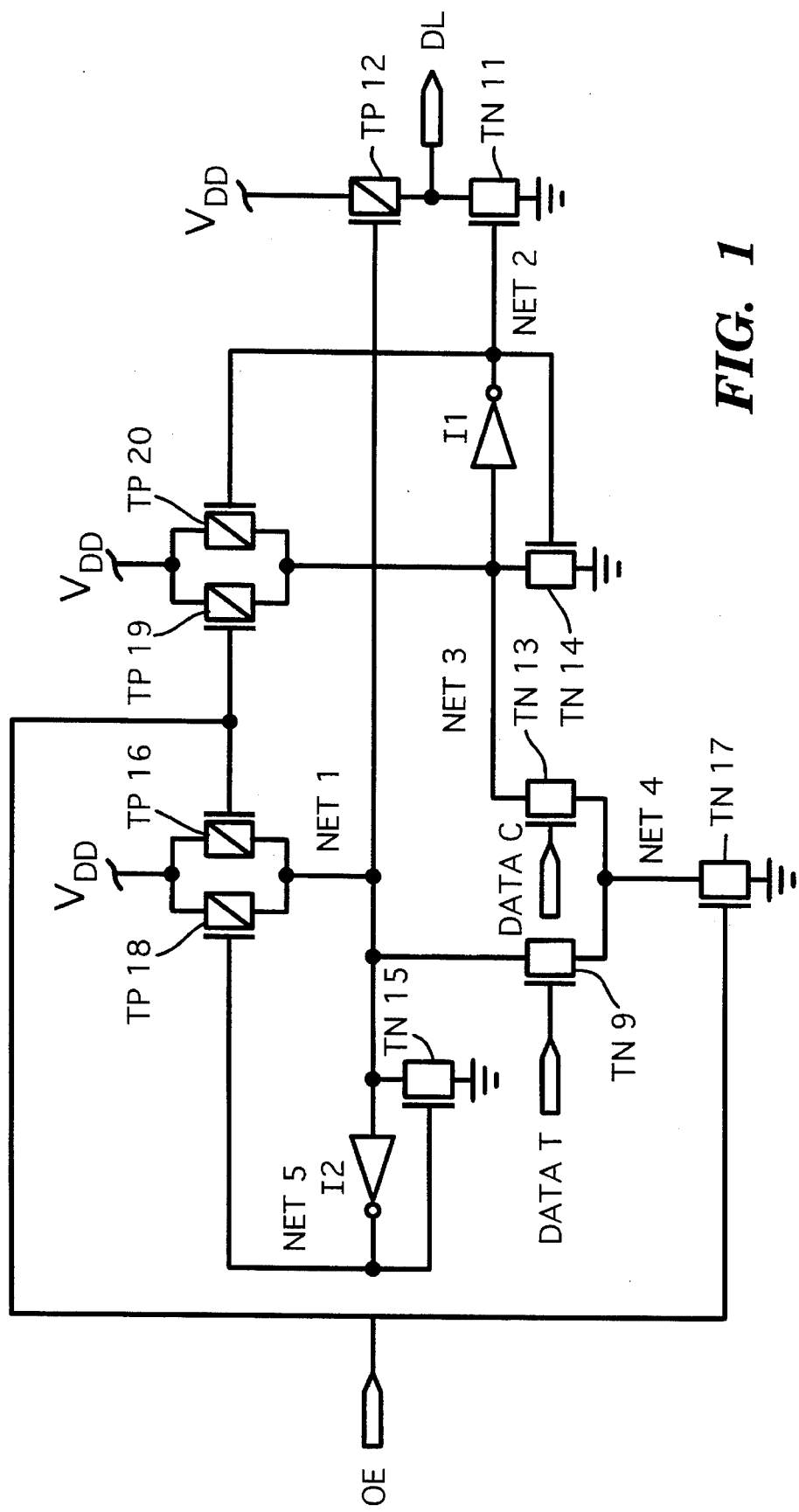
FIG. 1 is a circuit diagram of a first embodiment of the present invention.

With reference to FIG. 1, a first embodiment of the self-timed driver circuit of the invention is shown. In the depicted circuit, all of the transistors that have a reference symbol including a "P" are p-type field-effect transistors FETs), and all of the transistors that have a reference symbol including an "N" are n-type FETs.

The inputs DATAT and DATAC are connected to the gates of devices TN9 and TN13, respectively. The drain of device TN9 connects via NET 1 to the gate of the output device TP12, the input of inverter I2, the drain of device TN15, and the drains of TP18 and TP16. The drain of device TN13 connects via NET3 to the input of inverter I1, the drain of device TN14, and the drains of TP19 and TP20. The sources of both devices TN9 and TN13 are connected via NET4 to the drain of TN17.

The ready signal input, or Output Enable (OE) input, connects to the gate of device TN17, and to a first means, which includes devices TP18, TP16, TP19, and TP20. The input OE connects to the gates of devices TP16 and TP19. The sources of devices TP18 and TP16 are, in turn, coupled to VDD (a logic high voltage source), and the gate of device TP18 is connected via NET5 to the output of inverter I2 and to the gate of device TN15.

The sources of devices TP19 and TP20 are also coupled to VDD, and the gate of device TP20 connects via NET2 to the output of inverter I1, to the gate of device TN14, and to the gate of the output device TN11. The sources of devices TN17, TN14, and TN15 are all connected to ground (a logic low voltage source).

The output DL is coupled to the drains of output devices TP12 and TN11, making up the output means. The sources of devices TP12 and TN11 are coupled to VDD and ground, respectively.

In operation, when input OE is low, also known as a first control signal (when the system is not ready to receive data), devices TP16 and TP19 are switched on. This in turn transmits a '1' (a logic high voltage) to NET1 and NET3, turning off output device TP12 and, by action of inverter I1, output device TN11. When output devices TP12 and TN11 are switched off, the circuit is set or reset in tri-state mode, i.e., the output DL is electrically isolated.

When the system is ready to receive data, the OE input is driven high, also known as a second control signal, to place the driver circuit into a ready state. Devices TP16 and TP19 are switched off and device TN17 is switched on, grounding NET4. These devices may also be known as the ready means. The circuit is maintained in a tri-state mode until data appears at the inputs DATAC and DATAT since NET1 will be held at '1' by action of inverter I2 and device TP18 and NET2 will be held at '0' (a logic low voltage) through inverter I1 and device TP20.

As data is inputted into the tri-state driver circuit, the "true" data appears at the DATAT input and the one's complement of this data is placed at the DATAC input. By using this dual-rail differential input system, the driver circuit can smoothly switch into and out of the tri-state mode without producing intermediate false logic states. Furthermore, there is no crossover current. Therefore, the differential data can appear as short pulses and be stored on high impedance latches thereby providing leakage protection.

The ready state prepares the tri-state circuit to output a one or zero data signal, independent of any clock signal, in response to the input receiving a true or complement data signal, respectively. Once a true or complement data signal is received when the tri-state circuit is in the ready state, an output means, comprising TP12, TN11 and a single-ended output DL, immediately outputs the one or zero signal, respectively. Therefore, the output of the driver is truly self-timed from the arrival of the data.

The propagation of a '1' data signal is as follows: Reception of a '1' at input DATAT causes NET1 to fall to ground which turns on device TP12 and drives output DL high. NET5 rises and DATAT can return to '0' and NET1 remains low by action of inverter I2 and device TN15. Node DL is held at '1' until OE pulses low.

The propagation of a '0' data signal is as follows: Reception of a '1' at input DATAC causes NET3 to fall to ground and NET2 to rise, turning on device TN11 and driving output DL low. Input DATAC can return to '0' and NET2 remains high by action of inverter I1 and device TN14. Node DL is held at '0' until OE pulses low.

Figure 2:
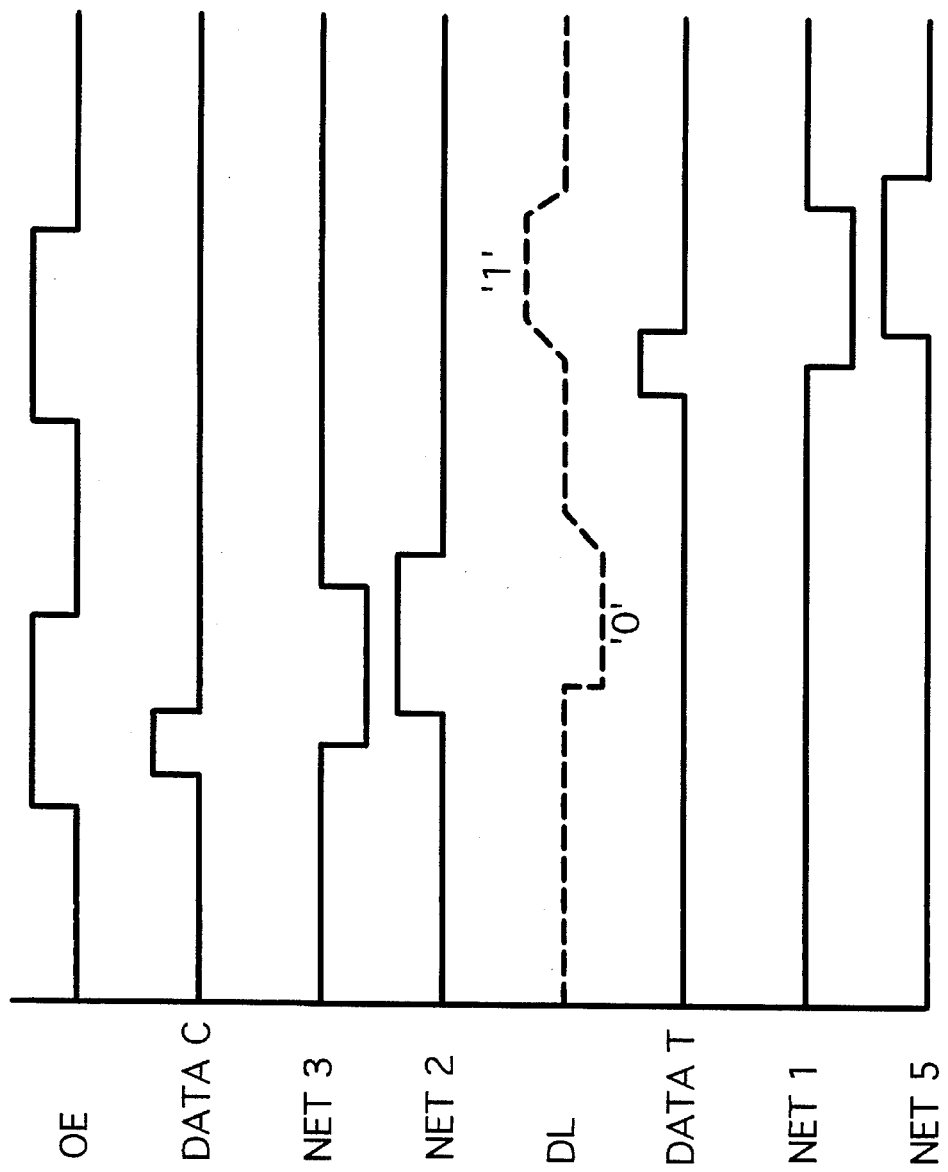
FIG. 2 is the timing diagram of FIG. 1.

FIG. 2 shows the resulting timing diagram for FIG. 1. As aforementioned, the OE signal can arrive before the data signal, allowing the data signal to be immediately gated to the output. The OE signal indicates the readiness of the system, such as an integrated circuit system.

Figure 3:
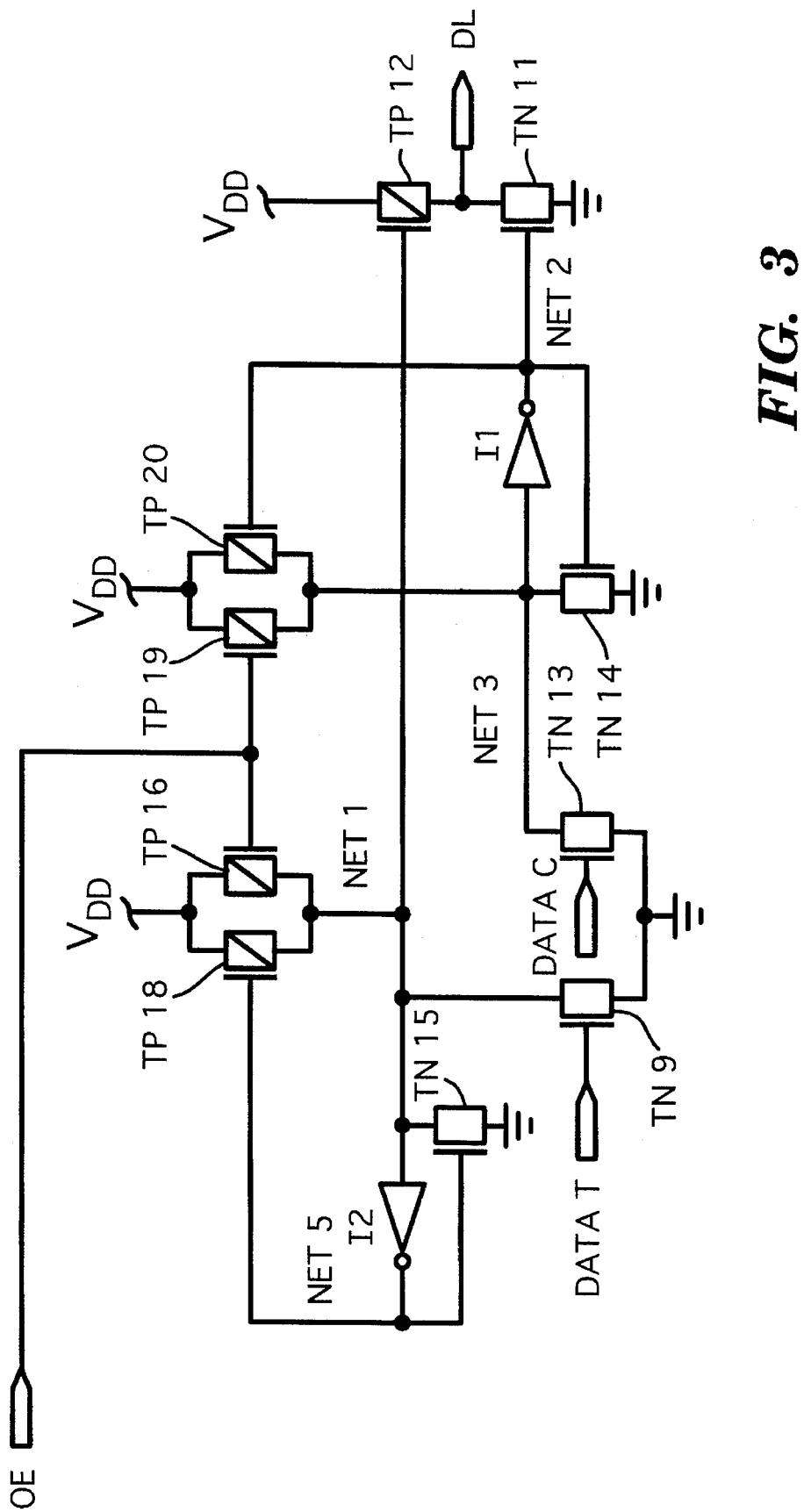
FIG. 3 is a circuit diagram of a second embodiment of the present invention.

A second embodiment of the invention is shown in FIG. 3. Instead of connecting the sources of devices TN9 and TN13 to the drain of device TN17, TN9 and TN13 are connected directly to ground and TN17 is completely removed. Input OE is then connected exclusively to the gates of devices TP16 and TP19. This circuit is functionally equivalent to the circuit as disclosed in FIG. 1.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A tri-state driver circuit comprising:
    a) first means for generating a tri-state mode from said tri-state driver circuit in response to said tri-state driver circuit receiving a first control signal;
    b) ready means, coupled to said first means, for creating a ready state in said tri-state driver circuit after said tri-state driver circuit receives a second control signal, said ready state preparing the tri-state driver circuit to output a one or zero signal, independent of a clock signal, in response to receiving a true or complement data signal, respectively, the tri-state mode being maintained during said ready state until said true or complement data signal is inputted into said circuit; and
    c) output means, coupled to said ready means, for outputting said one or zero signal from the tri-state driver circuit upon receiving said true or complement data signal, respectively, after the tri-state driver circuit is in said ready state.

2. A tri-state driver circuit as in claim 1, further comprising:
    d) a first and second input device for receiving said true and complement data signal, respectively.

3. A tri-state driver circuit as in claim 2, further comprising:
    e) a first storage device coupled between said first input device and said output means for storing said true data signal; and
    f) a second storage device coupled between said second input device and said output means for storing said complement data signal.

4. A tri-state driver circuit as in claim 1, wherein said second control signal is an output enable signal.

5. A tri-state driver circuit as in claim 4, wherein said first and second control signals are complements of each other.

6. A method of driving data through a tri-state driver circuit comprising the steps of:
    a) inputting a first control signal;
    b) generating a tri-state mode from said tri-state driver circuit in response to said tri-state driver circuit receiving said first control signal;
    c) inputting a second control signal;
    d) generating a ready state in the tri-state driver circuit after the tri-state driver circuit receives said second control signal, said ready state preparing said tri-state driver circuit to output a one or zero signal, independent of a clock signal, in response to receiving a true or complement data signal, respectively, said tri-state mode being maintained during said ready state until said true or complement data signal is inputted into said circuit;
    e) inputting a true or complement data signal; and
    f) outputting said one or zero signal from said tri-state driver circuit upon receiving said true or complement data signal, respectively, after said tri-state driver circuit is in said ready state.

7. The method as in claim 6, further comprising the step of:

g) storing said true and complement data signal on a first and second storage means, respectively.

8. An integrated circuit having a tri-state driver circuit, wherein the tri-state driver circuit comprises:

a) first means for generating a tri-state mode from said tri-state driver circuit in response to said tri-state driver circuit receiving a first control signal;

b) ready means, coupled to said first means, for creating a ready state in the tri-state driver circuit after the tri-state driver circuit receives a second control signal, said ready state preparing the tri-state driver circuit to output a one or zero signal, independent of a clock signal, in response to receiving a true or complement data signal, respectively, the tri-state mode being maintained during said ready state until said true or complement data signal is inputted into said circuit; and c) output means, coupled to said ready means, for outputting the one or zero signal from the tri-state driver circuit upon receiving the true or complement data signal, respectively, after said tri-state driver circuit is in said ready state.

9. A tri-state driver circuit as in claim 8, further comprising:

d) a first and second input device for receiving said true and complement data signal, respectively.

10. A tri-state driver circuit as in claim 9, further comprising:

e) a first storage device coupled between said first input device and said output means for storing said true data signal; and f) a second storage device coupled between said second input device and said output means for storing said complement data signal.

11. A tri-state driver circuit as in claim 8, wherein said second control signal is an output enable signal.

12. A tri-state driver circuit as in claim 11, wherein said first and second control signals are complements of each other.

* * * * *